(12) United States Patent
Pala

(10) Patent No.: US 12,374,999 B2
(45) Date of Patent: Jul. 29, 2025

(54) COMPOSITE SWITCH CIRCUIT WITH REDUCED POWER LOSS AND THE FORMING METHOD THEREOF

(71) Applicant: Monolithic Power Systems, Inc., Kirkland, WA (US)

(72) Inventor: Vipin Pala, San Jose, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 284 days.

(21) Appl. No.: 18/156,055

(22) Filed: Jan. 18, 2023

(65) Prior Publication Data

US 2024/0243665 A1 Jul. 18, 2024

(51) Int. Cl.
*H02M 3/335* (2006.01)
*H02M 1/08* (2006.01)

(52) U.S. Cl.
CPC ......... *H02M 3/33507* (2013.01); *H02M 1/08* (2013.01)

(58) Field of Classification Search
CPC ............ H02M 3/33507; H03K 17/567; H03K 17/08116; H03K 17/102; H03K 17/74; H03K 17/08104; H03K 17/6871; H03K 17/0822; H03K 17/6874; H03K 17/08122; H03K 17/08148; H03K 17/127; H03K 17/12

See application file for complete search history.

(56) References Cited

U.S. PATENT DOCUMENTS

| | | | |
|---|---|---|---|
| 2017/0092640 A1* | 3/2017 | Aoki | ........................ H03F 1/301 |
| 2020/0259489 A1 | 8/2020 | Pala | |
| 2022/0286125 A1* | 9/2022 | Kao | .......................... G05F 3/16 |
| 2022/0336215 A1 | 10/2022 | Pala et al. | |
| 2022/0344326 A1 | 10/2022 | Pala | |
| 2022/0406601 A1 | 12/2022 | Uppili et al. | |

* cited by examiner

*Primary Examiner* — Bryan R Perez
(74) *Attorney, Agent, or Firm* — Perkins Coie LLP

(57) ABSTRACT

A composite switch circuit having a normally-on power switch device and a normally-off power switch device in cascode configuration is discussed. The composite switch circuit is with reduced power loss by biasing a common connection of the source terminal of the normally-on power switch device and the drain terminal of the normally-off power switch device with a low voltage supply during a reverse recovery process of the composite switch circuit.

15 Claims, 7 Drawing Sheets

US 12,374,999 B2

COMPOSITE SWITCH CIRCUIT WITH REDUCED POWER LOSS AND THE FORMING METHOD THEREOF

BACKGROUND OF THE INVENTION

A composite cascode structure of junction field effect transistor (JFET) and metal oxide semiconductor field effect transistor (MOSFET) is well known in high voltage applications such as applications with voltage level of hundreds to thousands volts. FIG. 1 is a typical cascode structure 100 having a JFET J1 and a MOSFET M1. The JFET J1 is a normally-on device, with 200V-3000V operating voltage rating, while the MOSFET M1 is a normally-off device, with 5V-48V operating voltage rating. The so-called normally-on device may refer to a device that maintains at an ON state without applying a negative gate-source voltage. The so-called normally-off device may refer to a device that maintains at an OFF state without applying a positive gate-source voltage.

During the operation of the cascode structure 100, if the MOSFET M1 is OFF, and a voltage at the drain terminal D of the JFET rises, a voltage at a middle node md formed by a common connection of the JFET J1 and the MOSFET M1 would rise to a voltage higher than the JFET J1's pinch off voltage. Then, all the internal capacitors at the node md would be charged, which includes a) the reverse recovery charge of a body diode D1 of the MOSFET M1; b) the charge stored at the drain source capacitor $C_{DSM}$ of the MOSFET M1; and c) the charge stored at the gate source capacitor $C_{GSJ}$ of the JFET J1. The charge is supplied by the high voltage supply and would result in power loss when the energy stored in this capacitor is discharged.

DETAILED DESCRIPTION OF THE INVENTION

Embodiments of circuits for composite switch are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
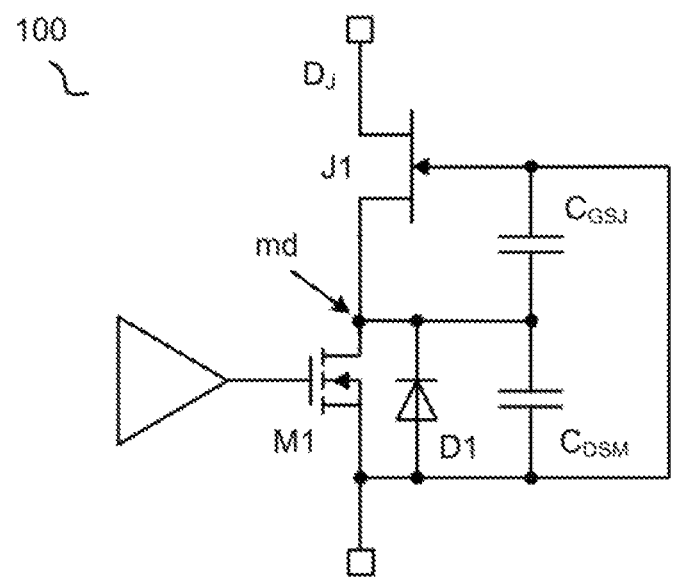
FIG. 1 schematically shows a typical cascode structure 100 in the prior art.
Figure 2:
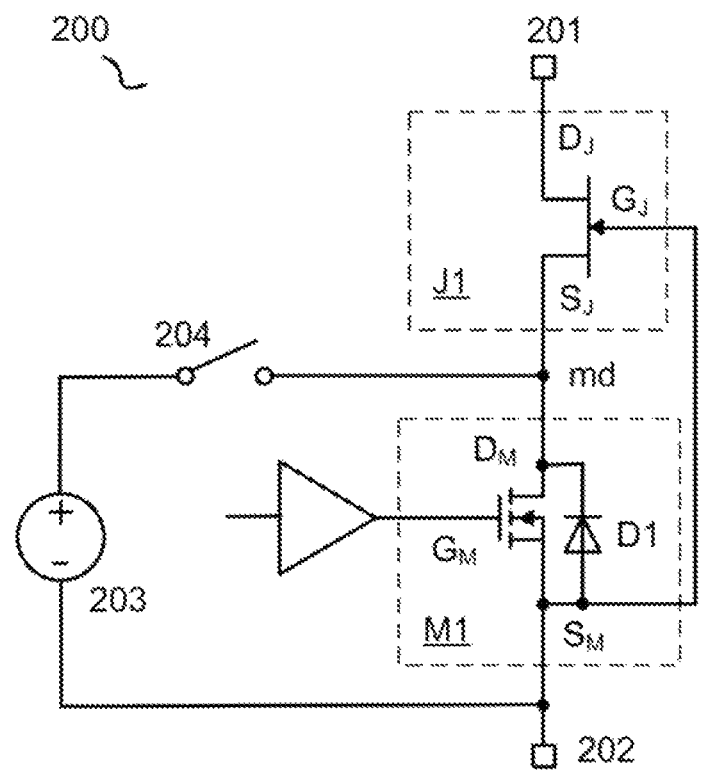
FIG. 2 schematically shows a composite switch circuit 200 in accordance with an embodiment of the present invention.

FIG. 2 schematically shows a composite switch circuit 200 in accordance with an embodiment of the present invention. In the example of FIG. 2, the composite switch circuit 200 comprises: a normally-on power switch device J1 and a normally-off power switch device M1, coupled in a cascode configuration. The normally-on power switch device J1 includes: a first drain terminal $D_J$ coupled to a first terminal 201 of the composite switch circuit 200, a first source terminal $S_J$, and a first gate terminal $G_J$. The normally-off power switch device M1 includes: a second drain terminal $D_M$, a second source terminal $S_M$ coupled to a second terminal 202 of composite switch circuit 200, and a second gate terminal $G_M$. The cascode configuration comprises: an electrical connection of the first source terminal $S_J$ to the second drain terminal $D_M$; and an electrical connection of the first gate terminal $G_J$ to the second source terminal $S_M$. The electrical connection of the first source terminal $S_J$ to the second drain terminal $D_M$ forms a middle node md.

In the example of FIG. 2, the composite switch circuit 200 further comprises: a voltage supply 203 and a bias switch 204, coupled in series between the second terminal 202 and the middle node md.

In one embodiment of the present invention, the normally-off power switch device M1 further is capable of reverse conduction where a current flows from the second terminal of the composite switch circuit 200 to the middle node md; and the bias switch 204 is configured to be turned on after the normally-off power switch device starts the reverse conduction (i.e., after the normally-off power switch device M1 starts conducting in a reverse direction). For example, the normally-off power switch device M1 further has a body diode D1; and the bias switch 204 is configured to be turned on when the body diode D1 is on, i.e., when there is current flowing through the body diode D1. The bias switch 204 is configured to be turned off after the normally-on power switch device and the normally-off power switch device (i.e., the cascode configured structure) are fully turned off, i.e., no current is flowing through the cascode configured structure.

The voltage supply 203 is with a relatively low voltage level, e.g., the voltage supply 203 may have a voltage value from 5V to 15V.

Figure 3:
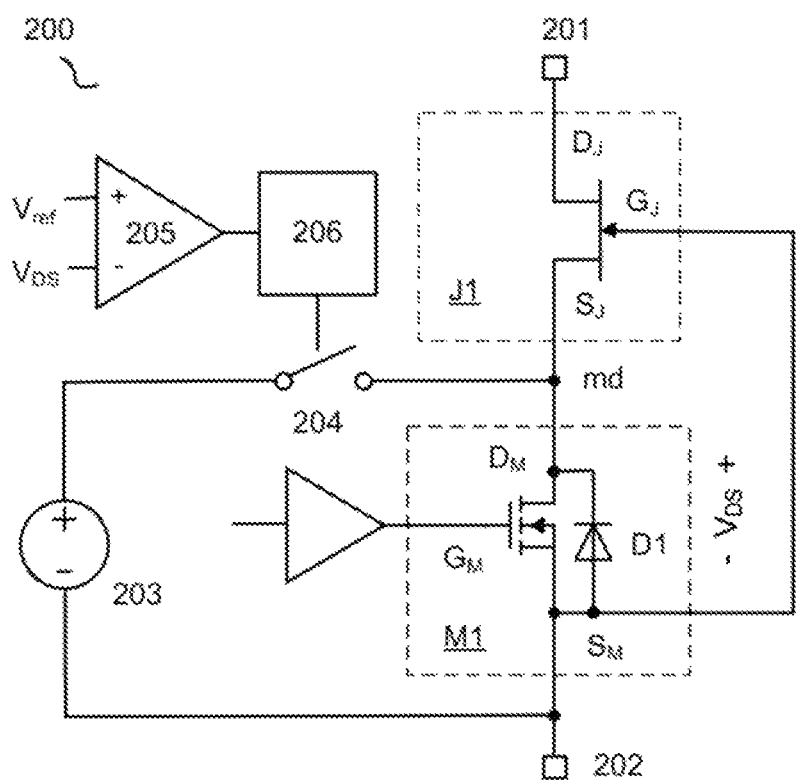
FIG. 3 schematically shows a turn-on control of the bias switch 204 in accordance with an embodiment of the present invention.

FIG. 3 schematically shows a turn-on control of the bias switch 204 in accordance with an embodiment of the present invention. In the example of FIG. 3, a voltage $V_{DS}$ across the normally-off power switch device M1 is compared with a reference voltage $V_{ref}$ by a comparator 205, if the voltage $V_{DS}$ is lower than the reference voltage $V_{ref}$, the bias switch 204 is controlled to be turned on by way of a logical circuit 206.

That is, the composite switch circuit 200 further comprises: the comparator 205 and the logical circuit 206. The comparator 205 is configured to compare the voltage $V_{DS}$ across the normally-off power switch device M1 with the reference voltage $V_{ref}$. The logical circuit 206 is configured to turn on the bias switch 204 if the voltage $V_{DS}$ is lower than the reference voltage $V_{ref}$.

Figure 4:
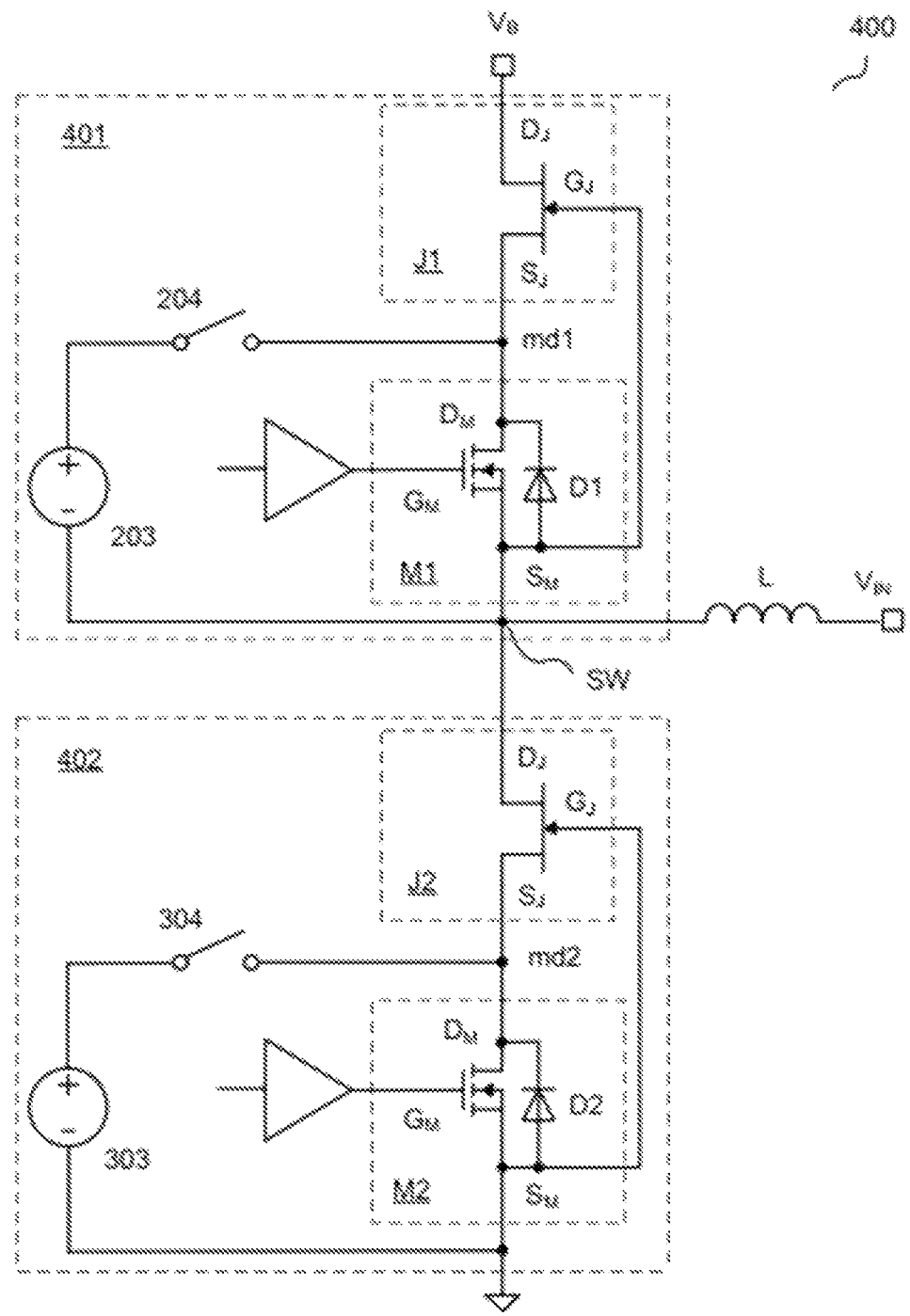
FIG. 4 schematically shows a half bridge circuit 400 with composite switch in accordance with an embodiment of the present invention.

FIG. 4 schematically shows a half bridge circuit 400 with composite switch in accordance with an embodiment of the present invention. In the example of FIG. 4, the half bridge circuit 400 comprises a high side power switch 401 and a low side power switch 402 coupled in series between a bus terminal $V_B$ and a reference ground. The electrical connection of the high side power switch 401 and the low side power switch 402 forms a switch node SW.

The high side power switch 401 comprises a composite switch circuit, which includes a first normally-on power switch device J1 and a first normally-off power switch device M1 coupled in a cascode configuration, as discussed hereinbefore with reference to FIG. 2. The electrical connection of the first source terminal $S_J$ of the first normally-on power switch device J1 to the second drain terminal $D_M$ of the first normally-off power switch device M1 forms a first middle node md1.

The low side power switch 402 also comprises a composite switch circuit, which includes a second normally-on power switch device J2 and a second normally-off power switch device M2 coupled in a cascode configuration, similar as the high side power switch 401. The electrical connection of the first source terminal $S_J$ of the second normally-on power switch device J2 to the second drain terminal $D_M$ of the second normally-off power switch device M2 forms a second middle node md2.

The high side power switch 401 further comprises: a first voltage supply 203 and a first bias switch 204, coupled in series between the first middle node md1 and the switch node SW. The first bias switch 204 is configured to be turned on when the body diode D1 of the first normally-off power switch device M1 is on, and is configured to be turned off when the high side power switch 401 is fully turned off.

The low side power switch 402 further comprises: a second voltage supply 303 and a second bias switch 304, coupled in series between the second middle node md2 and the reference ground. The second bias switch 304 is configured to be turned on when a body diode D2 of the second normally-off power switch device M2 is on, and is configured to be turned off when the low side power switch 402 is fully turned off.

In the example of FIG. 4, the half bridge circuit 400 further comprises: an inductor L, coupled between the switch node SW and an input terminal $V_{IN}$.

Figure 5:
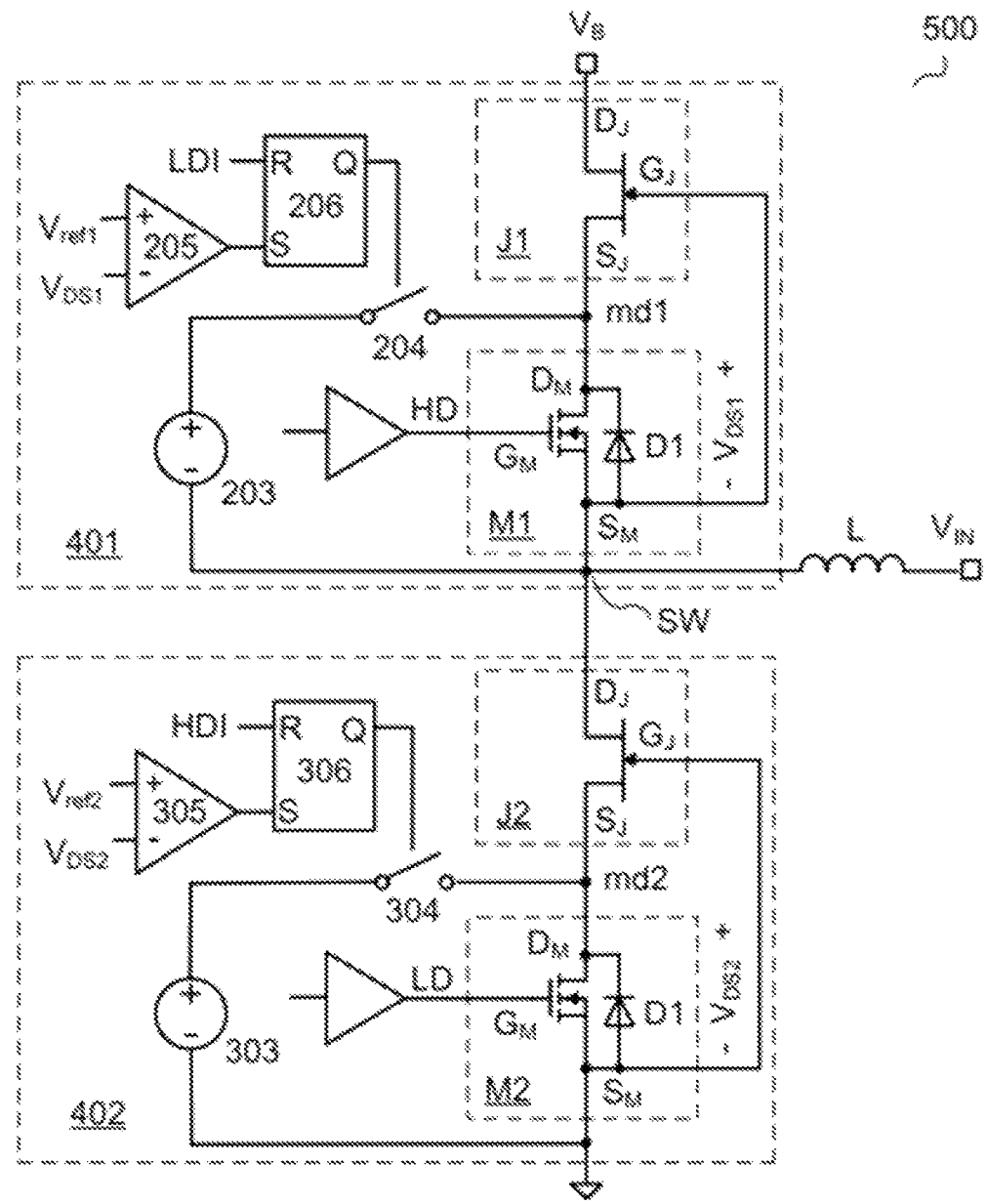
FIG. 5 schematically shows a half bridge circuit 500 with composite switch in accordance with an embodiment of the present invention.

FIG. 5 schematically shows a half bridge circuit 500 with composite switch in accordance with an embodiment of the present invention. In the example of FIG. 5, the controls of the first bias switch 204 and the second bias switch 304 are illustrated. A first voltage $V_{DS1}$ across the first normally-off power switch device M1 is compared with a first reference voltage $V_{ref1}$ by a first comparator 205. If the first voltage $V_{DS1}$ is lower than the first reference voltage $V_{ref1}$, the first bias switch 204 is turned on by way of a first logical circuit 206. A second voltage $V_{DS2}$ across the second normally-off power switch device M2 is compared with a second reference voltage $V_{ref2}$ by a second comparator 305. If the second voltage $V_{DS2}$ is lower than the second reference voltage $V_{ref2}$, the second bias switch 304 is turned on by way of a second logical circuit 306.

In the example of FIG. 5, the first logical circuit 206 and the second logical circuit 306 are both shown as a RS flip flop. The first logical circuit 206 is set by a comparison result of the first comparator 205, and is reset by a signal LDI indicative of a low side drive signal LD of the second normally-off power switch device M2. The second logical circuit 306 is set by a comparison result of the second comparator 305, and is reset by a signal HDI indicative of a high side drive signal HD of the first normally-off power switch device M1.

That is, the half bridge circuit 500 further comprises: the first comparator 205, the first logical circuit 206, the second comparator 305, and the second logical circuit 306. The first comparator 205 is configured to compare the first voltage $V_{DS1}$ across the first normally-off power switch device M1 with the first reference voltage $V_{ref1}$. The first logical circuit 206 is configured to be set to turn on the first bias switch 204 if the first voltage $V_{DS1}$ is lower than the first reference voltage $V_{ref1}$; and is configured to be reset to turn off the first bias switch 204 when the low side power switch 402 is turned on. The second comparator 305 is configured to compare the second voltage $V_{DS2}$ across the second normally-off power switch device M2 with the second reference voltage $V_{ref2}$. The second logical circuit 306 is configured to be set to turn on the second bias switch 304 if the second voltage $V_{DS2}$ is lower than the second reference voltage $V_{ref2}$, and is configured to be reset to turn off the second bias switch 304 when the high side power switch 401 is turned on.

Figure 6:
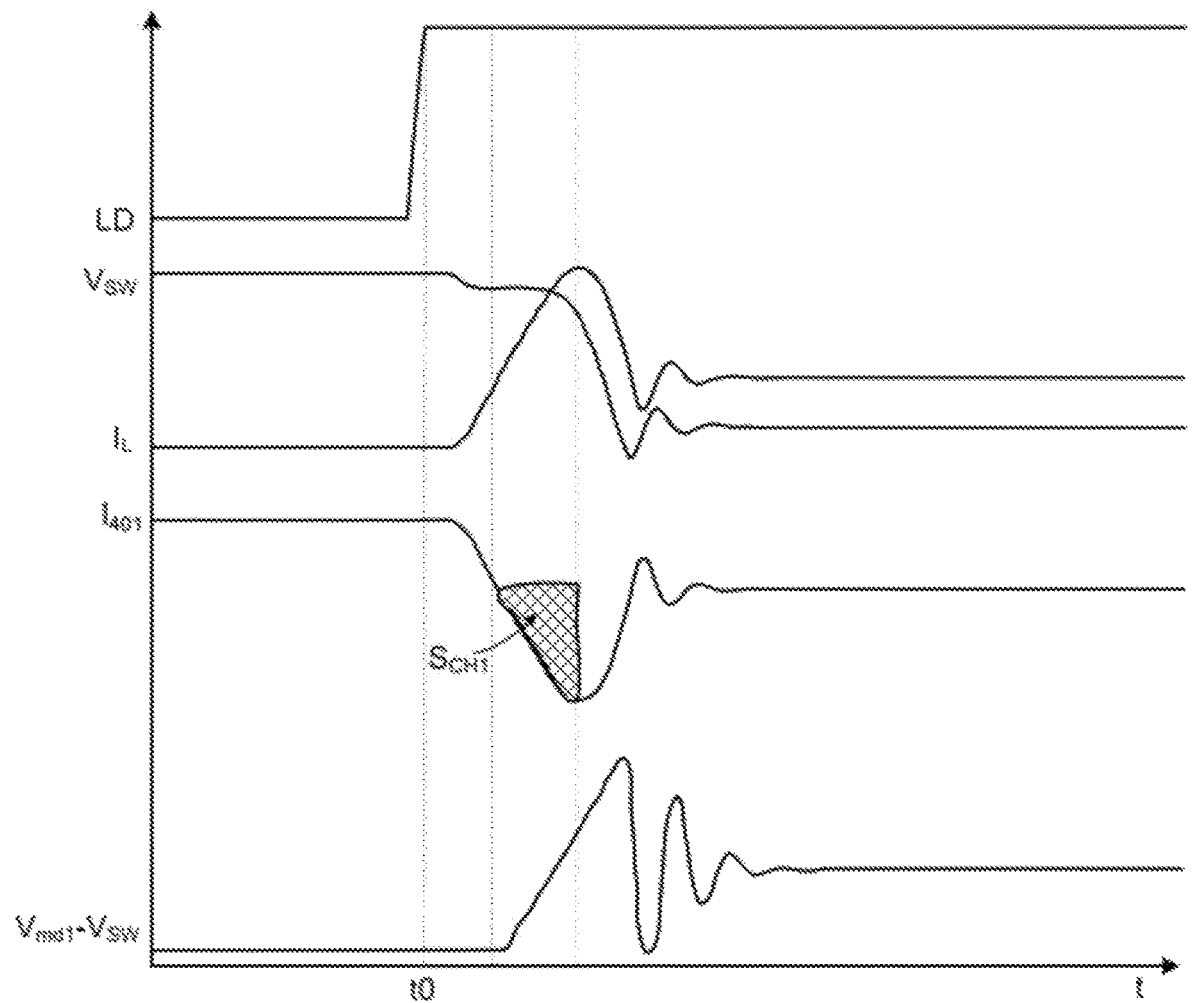
FIG. 6 schematically shows timing waveforms of the low side drive signal LD, a voltage $V_{SW}$ at the switch node SW, a current $I_L$ flowing through the inductor L, a current $I_{401}$ flowing through the high side power switch 401, and a voltage difference $V_{md1}-V_{SW}$ between a voltage at the first middle node md1 and the voltage $V_{SW}$ at the switch node SW if using the conventional composite switch 100 as the power switch in the half bridge circuit 500.

FIG. 6 schematically shows timing waveforms of the low side drive signal LD, a voltage $V_{SW}$ at the switch node SW, a current $I_L$ flowing through the inductor L, a current $I_{401}$ flowing through the high side power switch 401, and a voltage difference $V_{md1}-V_{SW}$ between a voltage at the first middle node md1 and the voltage $V_{SW}$ at the switch node SW if using the conventional composite switch 100 as the power switch in the half bridge circuit 500.

Figure 7:
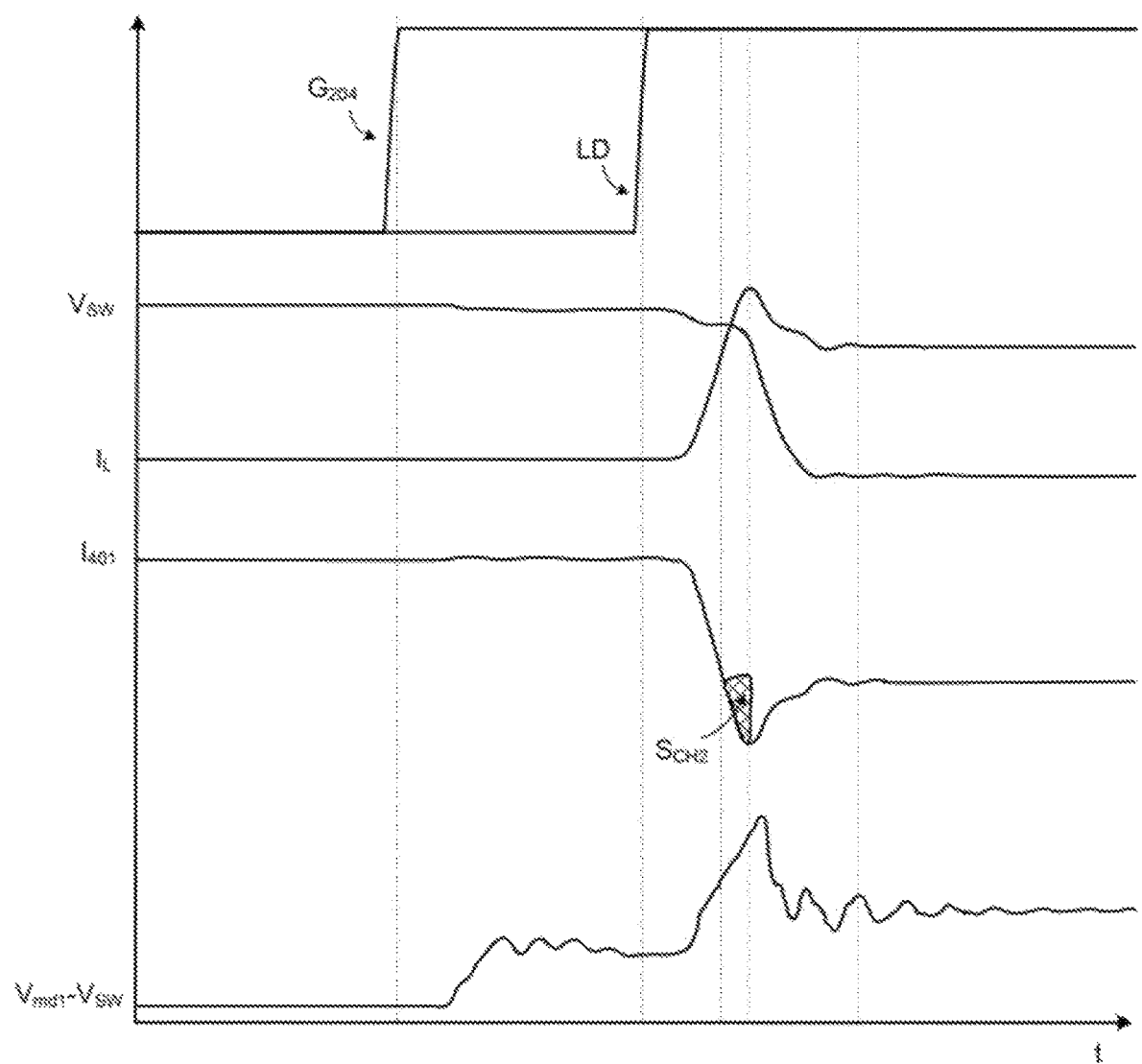
FIG. 7 schematically shows timing waveforms of a signal $G_{204}$ used to drive the bias switch 204, the low side drive signal LD, the voltage $V_{SW}$ at the switch node SW, the current $I_L$ flowing through the inductor L, the current $I_{401}$ flowing through the high side power switch 401, and the voltage difference $V_{md1}-V_{SW}$ between the voltage at the first middle node md1 and the voltage $V_{SW}$ at the switch node SW using the composite switch circuit 200 as the power switch in the half bridge circuit 500.

FIG. 7 schematically shows timing waveforms of a signal $G_{204}$ used to drive the bias switch 204, the low side drive signal LD, the voltage $V_{SW}$ at the switch node SW, the current $I_L$ flowing through the inductor L, the current $I_{401}$ flowing through the high side power switch 401, and the voltage difference $V_{mid1}-V_{SW}$ between the voltage at the first middle node md1 and the voltage $V_{SW}$ at the switch node SW using the composite switch circuit 200 as the power switch in the half bridge circuit 500.

As shown in FIG. 6, during the transition from the high side power switch to low side power switch, i.e., from the time point t0 when the low side drive signal LD starts to turn high to turn on the low side power switch 402, the reverse recovery phase of the composite switch (i.e., the cascode configured structure) 100 starts. The body diode D1 is conducting, and the normally-on JFET J1 is also on. By the end of the reverse recovery phase, the composite switch circuit 100 supports a totality of the high voltage bus which is 200V-3000V between the source terminal of M1 and the drain terminal of J1. Then the voltage at the middle node md increases to the pinch-off voltage of the JFET J1. The charge supplied to the capacitances that are coupled to the middle node md, as well as the reverse recovery charge of the body diode D1 is supplied by the high voltage supply which is as high as between 200 and 3000 volts. So the charge loss in the reverse recovery phase is large, as shown the shaded area $S_{CH1}$ in FIG. 6.

Because of the existence of the power supply 203 (and/or 303) and the corresponding bias switch 204 (and/or 304), when the normally-off power switch device M1 (and/or M2) is turned off, once its body diode D1 (and/or D2) flows current, the bias switch 204 (and/or 304) is turned on. In this case, before the voltage between the drain terminal $D_J$ of J1 and source terminal $S_M$ of M1 rises, the middle node md has been charged to a voltage that is close to the pinch off voltage of the JFET J1. Then the middle node md (and/or md1 or md2) is biased to the voltage of the power supply 203 (and/or 303). Since the power supply has a low voltage value, the current would shift from the body diode to the power supply. Thus, the body diode stops conducting. In this case the reverse recovery charge of the body diode D1, and the charge stored in the capacitances $C_{GSJ}$ and $C_{DSM}$ is supplied by the low voltage power supply 203, which is normally between 5 to 15V. That is, during the reverse recovery phase, when the voltage at the drain terminal $D_J$ of J1 rises, only the drain-gate capacitance and drain-source capacitance of J1 are supplied by the high voltage supply. Then the stored energy at the middle node is much lower than the prior art, as shown the shaded area $S_{CH2}$ in FIG. 7, which highly reduces power loss.

Figure 8:
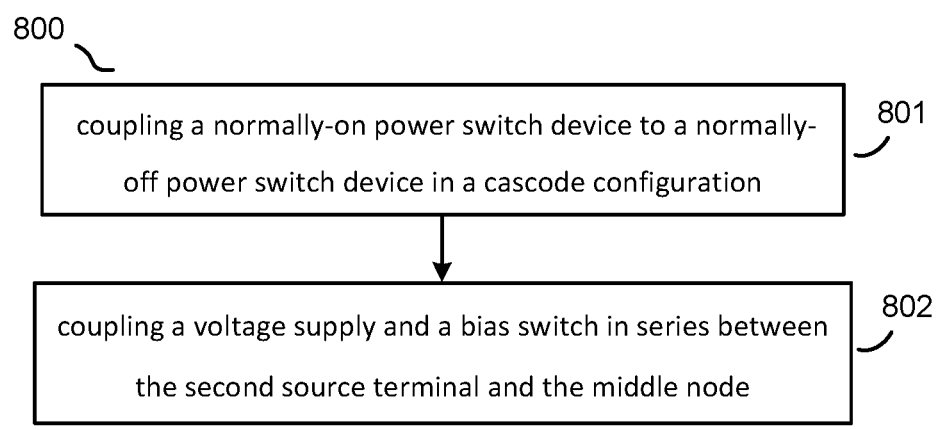
FIG. 8 schematically shows a flowchart 800 of a method for forming a composite switch circuit in accordance with an embodiment of the present invention.

FIG. 8 schematically shows a flowchart 800 of a method for forming a composite switch circuit in accordance with an embodiment of the present invention. The method comprises:

Step 801, coupling a normally-on power switch device to a normally-off power switch device in a cascode configuration. The normally-on power switch device includes: a first drain terminal, a first source terminal, and a first gate terminal. The normally-off power switch device includes: a second drain terminal, a second source terminal, and a second gate terminal. The cascode configuration comprises: an electrical connection of the first source terminal to the second drain terminal; and an electrical connection of the first gate terminal to the second source terminal. The electrical connection of the first source terminal to the second drain terminal forms a middle node. The normally-off power switch device may or may not have a body diode. And Step 802, coupling a voltage supply and a bias switch in series between the second source terminal and the middle node.

In one embodiment of the present invention, the bias switch is controlled to be turned on when the body diode is on, or prior to a reverse recovery process of the composite switch circuit.

In one embodiment of the present invention, the bias switch is controlled to be turned off when the cascode configuration is fully turned off.

In one embodiment of the present invention, the voltage supply is with a relatively low voltage level, e.g., between 5V-15V.

In one embodiment of the present invention, the method further comprises: comparing a voltage across the normally-off power switch device with a reference voltage; and turning on the bias switch if the voltage across the normally-off power switch device is lower than the reference voltage.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

The invention claimed is:

1. A composite switch circuit, served as a high side power switch device in a half bridge circuit, the composite switch circuit comprising:
   a normally-on power switch device and a normally-off power switch device, coupled in a cascode configuration; wherein the normally-on power switch device has: a first drain terminal coupled to a first terminal of the composite switch circuit, a first source terminal, and a first gate terminal; the normally-off power switch device has: a second drain terminal, a second source terminal coupled to a second terminal of composite switch circuit, and a second gate terminal; the cascode configuration comprises: an electrical connection of the first source terminal to the second drain terminal; and an electrical connection of the first gate terminal to the second source terminal; and wherein the electrical connection of the first source terminal to the second drain terminal forms a middle node; and
   a voltage supply and a bias switch, coupled in series between the second terminal of composite switch circuit and the middle node, wherein the bias switch is controllable.

2. The composite switch circuit of claim 1, wherein the normally-off power switch device is capable of reverse conduction where a current flows from the second terminal of the composite switch circuit to the middle node, and wherein: the bias switch is configured to be turned on after the normally-off power switch device starts the reverse conduction.

3. The composite switch circuit of claim 1, wherein:
   the bias switch is configured to be turned off after the normally-on power switch device and the normally-off power switch device are fully turned off.

4. The composite switch circuit of claim 1, further comprising:
   a comparator, configured to compare a voltage across the normally-off power switch device with a reference voltage; and
   a logical circuit, configured to turn on the bias switch if the voltage across the normally-off power switch device is lower than the reference voltage.

5. The composite switch circuit of claim 4, wherein the half bridge circuit further has a low side power switch device, and wherein:
   the logical circuit is further configured to turn off the bias switch when the low side power switch is turned on.

6. The composite switch circuit of claim 1, wherein:
   the normally-on power switch device comprises a junction field effect transistor; and
   the normally-off power switch device comprises a metal oxide semiconductor field effect transistor.

7. A composite switch circuit, comprising:
   a first terminal;
   a second terminal;
   a normally-on power switch device and a normally-off power switch device, coupled in a cascode configuration between the first terminal and the second terminal; the normally-on power switch having: a first drain terminal coupled to the first terminal, a first source terminal, and a first gate terminal; the normally-off power switch device having: a second drain terminal, a second source terminal coupled to the second terminal, and a second gate terminal; the cascode configuration comprising: an electrical connection of the first source terminal to the second drain terminal, and an electrical connection of the first gate terminal to the second source terminal; and the electrical connection of the first source terminal to the second drain terminal forming a middle node; and a voltage supply and a bias switch, coupled in series between the second terminal and the middle node, wherein the bias switch is controllable.

8. The composite switch circuit of claim 7, wherein the normally-off power switch device further is capable of reverse conduction where a current flows from the second terminal of the composite switch circuit to the middle node, and wherein:

the bias switch is configured to be turned on after the normally-off power switch device starts the reverse conduction.

9. The composite switch circuit of claim 7, wherein:

the bias switch is configured to be turned off after the normally-on power switch device and the normally-off power switch device are fully turned off.

10. The composite switch circuit of claim 7, further comprising:

a comparator, configured to compare a voltage across the normally-off power switch device with a reference voltage; and a logical circuit, configured to turn on the bias switch if the voltage across the normally-off power switch device is lower than the reference voltage.

11. The composite switch circuit of claim 7, wherein:

the normally-on power switch device comprises a junction field effect transistor; and the normally-off power switch device comprises a metal oxide semiconductor field effect transistor.

12. A method for forming a composite switch circuit, comprising:

coupling a normally-on power switch device to a normally-off power switch device in a cascode configuration; the normally-on power switch device having: a first drain terminal, a first source terminal, and a first gate terminal; the normally-off power switch device having: a second drain terminal, a second source terminal, and a second gate terminal; the cascode configuration comprising: an electrical connection of the first source terminal to the second drain terminal, and an electrical connection of the first gate terminal to the second source terminal; and the electrical connection of the first source terminal to the second drain terminal forming a middle node; and coupling a voltage supply and a bias switch in series between the second source terminal and the middle node, wherein the bias switch is controllable.

13. The method of claim 12, wherein the normally-off power switch device further has a body diode; and wherein:

the bias switch is controlled to be turned on when the body diode is on.

14. The method of claim 12, wherein the bias switch is controlled to be turned on prior a reverse recovery process of the composite switch circuit.

15. The method of claim 12, further comprises:

comparing a voltage across the normally-off power switch device with a reference voltage; and turning on the bias switch if the voltage across the normally-off power switch device is lower than the reference voltage.

* * * * *